(12) United States Patent
Daughton et al.

(10) Patent No.: US 6,429,640 B1
(45) Date of Patent: Aug. 6, 2002

(54) GMR HIGH CURRENT, WIDE DYNAMIC RANGE SENSOR

(75) Inventors: James Daughton, Eden Prairie; John Stokes, Rochester, both of MN (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 31 days.

(21) Appl. No.: 09/643,902

(22) Filed: Aug. 21, 2000

(51) Int. Cl.[7] .............................................. G01R 33/00
(52) U.S. Cl. ............... 324/117 R; 324/252; 324/207.21
(58) Field of Search .................................. 324/252, 324, 324/207.21, 360, 117 R, 207.12, 207.19, 207.22, 529; 338/32 R (56) References Cited

U.S. PATENT DOCUMENTS

| | | |
|---|---|---|
| 3,621,334 A | 11/1971 | Burns et al. |
| 4,097,802 A | 6/1978 | Mazzeo et al. |
| 4,414,510 A | 11/1983 | Milkovic |
| 4,425,596 A | 1/1984 | Satou |
| 4,520,311 A | 5/1985 | Petr et al. |
| 5,005,064 A | 4/1991 | Yoshino et al. |
| 5,049,809 A | 9/1991 | Wakatsuki et al. |
| 5,119,025 A | 6/1992 | Smith et al. |
| 5,122,227 A | 6/1992 | Ott |
| 5,260,653 A | 11/1993 | Smith et al. |
| 5,302,461 A | 4/1994 | Anthony |
| 5,313,186 A | 5/1994 | Schuhl et al. |
| 5,329,413 A | 7/1994 | Kondoh et al. |
| 5,399,965 A | 3/1995 | Heberle |
| 5,432,494 A * | 7/1995 | Inoue et al. ............... 338/32 R |
| 5,512,818 A | 4/1996 | Jin et al. |
| 5,561,366 A | 10/1996 | Takahashi et al. |
| 5,561,368 A | 10/1996 | Dovek et al. |
| 5,615,075 A | 3/1997 | Kim |
| 5,636,159 A | 6/1997 | Pohm |
| 5,719,494 A * | 2/1998 | Dettmann et al. ...... 324/117 R |
| 5,729,137 A | 3/1998 | Daughton et al. |
| 5,831,426 A | 11/1998 | Black et al. |
| 5,923,514 A | 7/1999 | Scott et al. |

\* cited by examiner

*Primary Examiner*—N. Le
*Assistant Examiner*—Vincent Q. Nguyen
(74) *Attorney, Agent, or Firm*—William G. Auton (57) ABSTRACT

A configuration where a wide range of current can be sensed accurately in spite of using a magnetic material with non-linearities and limited hysteresis. This configuration includes: a strip line current carrier, an IC chip containing a GMR sensor element, an integrated drive coil, like an isoloop. Field produced by current in the strip line is detected by the sensor. Feedback field is produced by current in an on-chip coil to counteract spurious fields from the strip line.

2 Claims, 14 Drawing Sheets

GMR HIGH CURRENT, WIDE DYNAMIC RANGE SENSOR

STATEMENT OF GOVERNMENT INTEREST

The invention described herein may be manufactured and used by or for the Government for governmental purposes without the payment of any royalty thereon.

BACKGROUND OF THE INVENTION

This present invention relates generally to current sensors, and more specifically the invention pertains to a high current, wide dynamic range sensor. Giant Magnetoratio (GMR) sensors detect current phenomena and ground faults in a power distribution circuit. Powered by a 20 V DC or AC source, the output of a solid state chip having a GMR sensor adjacent to a conductor is a full-wave rectified form of the current in the conductor. This is fed to the current sampling circuit of the electronic trip unit of a circuit breaker and can be used to trip the circuit breaker when overcurrent conditions are detected.

Examples of GMR current sensor applications are disclosed in the following U.S. patents, copies of which are attached to the Information Disclosure Statement submitted herewith, and incorporated herein by reference.

U.S. Pat. No. 3,621,334 issued to Burn et al.;
U.S. Pat. No. 4,425,596 issued to Satou;
U.S. Pat. No. 5,049,809 issued to Wakatsuki et al.;
U.S. Pat. No. 5,615,075 issued to Kim;
U.S. Pat. No. 5,923,514 issued to Scott et al.;
U.S. Pat. No. 5,729,137 issued to Daughton et al.;
U.S. Pat. No. 5,561,368 issued to Dovek et al.;
U.S. Pat. No. 5,831,426 issued to Black et al.;
U.S. Pat. No. 4,097,802 issued to Mazzeo et al.;
U.S. Pat. No. 4,414,510 issued to Milkovic;
U.S. Pat. No. 4,520,311 issued to Petr et al.;
U.S. Pat. No. 5,005,064 issued to Yoshino et al.;
U.S. Pat. No. 5,119,025 issued to Smith et al.;
U.S. Pat. No. 5,260,653 issued to Smith et al.;
U.S. Pat. No. 5,561,368 issued to Dovek et al.;
U.S. Pat. No. 5,122,227 issued to Ott;
U.S. Pat. No. 5,302,461 issued to Anthony;
U.S. Pat. No. 5,313,186 issued to Schuhl et al.;
U.S. Pat. No. 5,329,413 issued to Kondoh et al.;
U.S. Pat. No. 5,399,965 issued to Heberle;
U.S. Pat. No. 5,636,159 issued to A. Pohm;
U.S. Pat. No. 5,512,818 issued to Jin et al.;
U.S. Pat. No. 5,561,366 issued to Takahashi et al.

The above-cited patents are instructive in the technology. For example, they show a current sensor has a closed loop magnetic hoop with a gap and a central aperture for receiving a conductor. An IC chip incorporating a GMR sensor can be positioned in the gap to provide a measure of the current in the conductor. A relatively small current transformer provides the necessary information about the direction of the current to an electronic trip unit for a circuit breaker as well as power supply for the IC chip and the trip unit. The trip unit operates in the presence of AC and DC faults. In a three phase power system, a single GMR chip in the proximity of three closely spaced phase conductors, together with a current measurement from the neutral line, enable trip units to operate on the occurrence of AC and DC faults.

There are applications where accuracy over a wide dynamic range is required for current sensing. A need remains for a configuration where a wide range of current can be sensed accurately in spite of using a magnetic material with non-linearities and limited hysteresis. The present invention is intended to satisfy that need.

SUMMARY OF THE INVENTION

The present invention is a GMR high current, wide dynamic range sensor containing: a strip line current carrier, an IC chip containing a GMR sensor element, and an integrated drive coil, like an isoloop.

The cross section of the strip line, which could be on a PC card, or could be a wire, is external to an IC chip containing a GMR sensor element and an integrated drive coil, like the isoloop. Field produced by current in the strip line is detected by the sensor. Feedback field is produced by current in an on-chip coil. In many applications, the current in the strip line is large (say 10 Amps), while it is desirable to make the feedback current small. Also, if high accuracy is required over a large dynamic range, at low current level, spurious fields to magnetized bodies or current in other lines may limit the accuracy of the sensor.

DETAILED DESCRIPTION OF THE PREFERRED EMBODIMENT

Figure 1:
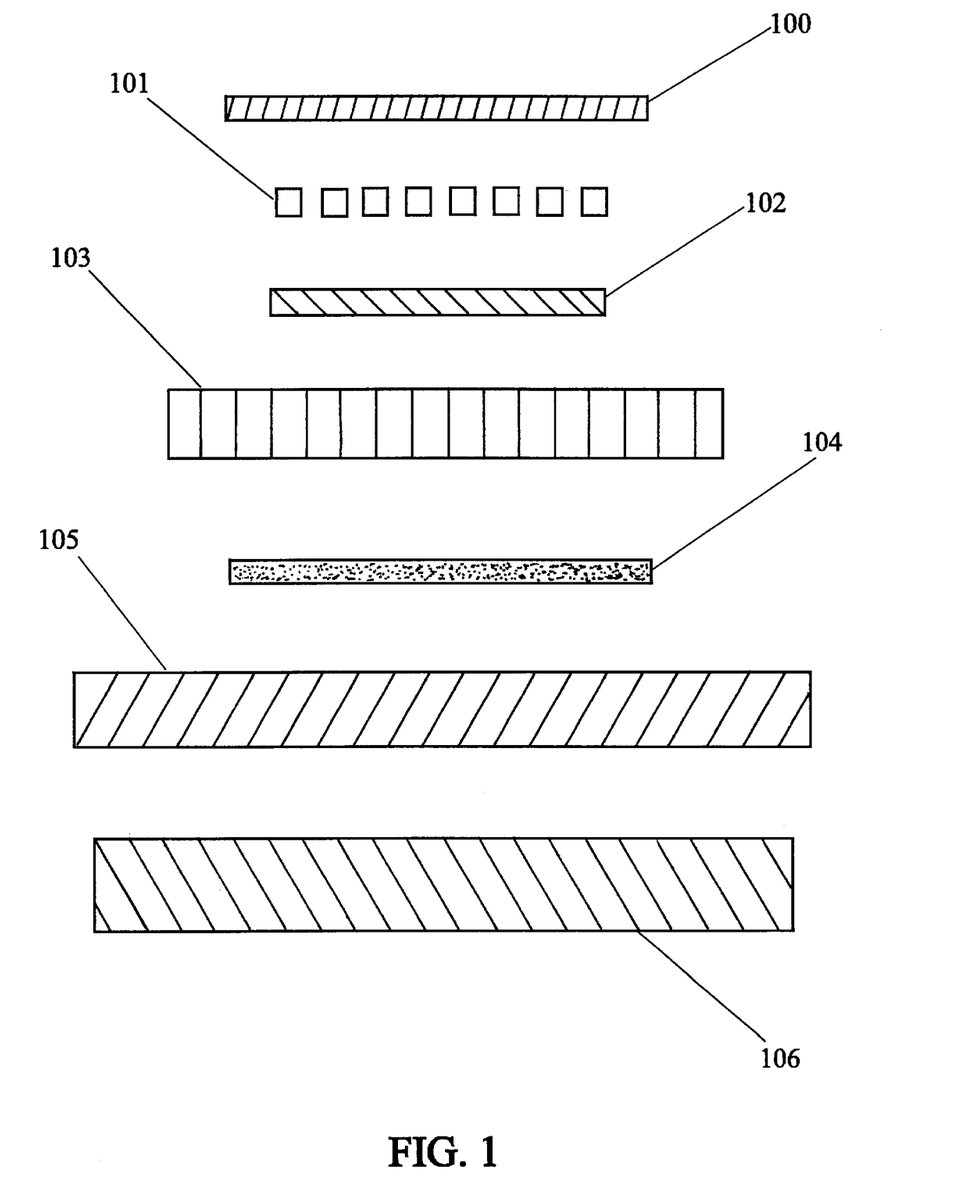
FIG. 1 shows the preferred embodiment of the invention.

The present invention is a GMR high current, wide dynamic range sensor containing: a strip line current carrier, an IC chip containing a GMR sensor element, and an integrated drive coil, like an isoloop, as the basic required elements of the invention. FIG. 1 shows the preferred embodiment of the invention. FIG. 1 shows a GMR high current, wide dynamic range sensor composed of seven operating elements: a shield/attenuator 100, an integrated drive coil with on-chip turns 101, the GMR sensor material 102, the silicon chip 103, a second shield/attenuator 104, the strip line 105, and a shield/concentrator 106. The elements denoted as optional are not necessary for a functioning current sensor and are optional. This system is a configuration where a wide range of current can be sensed accurately in spite of using a magnetic material with non-linearities and limited hysteresis.

Giant Magnetoratio (GMR) sensors can be used for current sensing and isolation. Understanding the unique capability of GMR to provide isolation and current sensing is critical to understanding the benefits they offer for this application.

GMR sensors are thin film devices that are a composite of magnetic and non-magnetic layers that exhibit a resistance change that is directly proportional to an applied magnetic field. In general, thin ferromagnetic films have a higher resistivity if they are thinner than the mean free path of conduction electrons in the bulk material. This is because electrons are scattered from the surfaces of the films where electrons lose momentum and energy, as well as being scattered in the interior (or bulk) of the film; thus surface scattering plays an important role in the resistivity of thin films, and for sufficiently thin films, surface scattering can be the dominant factor in resistivity. The mean free path of electrons in many ferromagnetic alloys is on the order of 100 angstroms, and for films on the order of 50 angstroms or less, the surface scattering component is very large. The magnetic and nonmagnetic layers which compose a GMR structure are less than 50 angstroms in thickness.

A current of 40 Amperes in a 2 mm wide strip line normally produces about 40/(2)0.002 or 10,000 A/m or 125 Oe. Spurious fields of 10 Oe would cause a serious error unless there is some form of shielding. This could be done with a magnetic body back of the strip line, of the proper geometry and permeability to act as a shield for the sensor, and would give almost twice the field at the sensor (250 Oe for the example cited). Various combinations of shielding and field enhancements or attenuations are possible, depending on the current to be sensed and the accuracy required and the magnitude of external fields.

This on-chip coil can generate about 1 Oe/mA with relative ease. Thus, with 15 mA in the on-chip coil, the applied field can be 15 Oe. With 5 Amperes in the strip line described in the preceding paragraph, the field would be about 15 Oe. The on-chip coil current can be adjusted through feedback circuitry to cancel the field from the strip line. This could be the case whether the current in the strip line is 1 A, 2 A, or other values. So long as the field is held constant, the sensor does not see a range of total field, and hence hysteresis would not affect accuracy. A wide dynamic range is possible by this technique.

Thus, the sensor configurations with the on-chip coil and external strip line can provide a wide dynamic range and external strip line can provide a wide dynamic range and high accuracy sensor. The best reference cited above for use in the present invention is the magnetic field sensor patent by James Daughton. This system eyes "field sensory elements" designated by element numeral 17. In the present invention, the isoloop can similarly detect the magnetic field of a current through a strip line which can be correlated to the specific field values detected by the GMR sensor.

Samples of suitable GMR sensors are shown with the above-cited patents. Similarly other elements such as feedback circuits and isoloops are individually known. What is unique about this GMR sensor is the combination of elements to isolate and protect the sensor either dynamically, through the integrated drive coil, or statically through the magnetic shield element.

The GMR current sensor has the potential to dramatically increase the reliability of solid state relays in present and future satellite systems. Present relays suffer from a number of deficiencies. The number one deficiency is the signal bandwidth. Present systems either use opto-isolators or transformer coupling to provide isolations. Both of these techniques suffer from, maintaining good current monitoring with isolations, opto-isolator degradation with time and radiation, DC isolations, low in insertion loss, and linearity. GMR current sensing eliminates these deficiencies while maintaining extremely wide bandwidth.

The present invention is a combination of three major elements that result in an improved system over the prior art. More specifically, it is a magnetic current sensor that uses a GMR sensor with a concentrator to sense current. In order to understand this technology, consider the basic prior art magnetic current sensor of FIG. 2.

Figure 2:
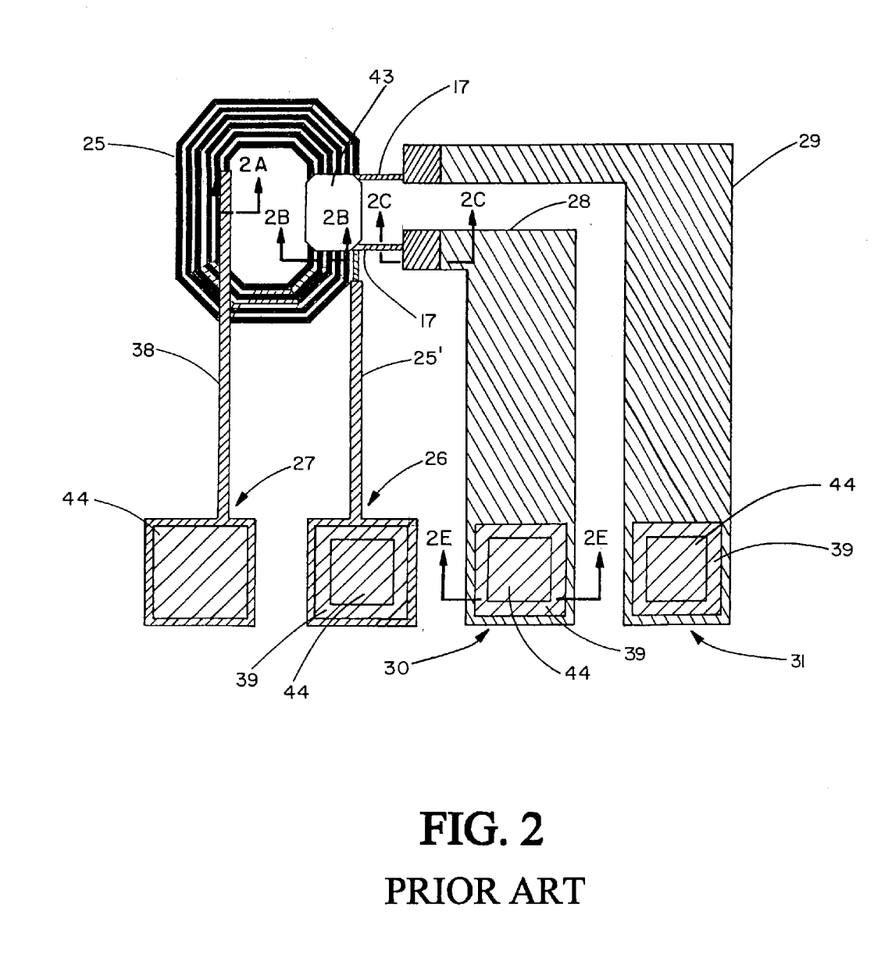
FIG. 2 is a prior art magnetic current sensor.

FIG. 2 is the magnetic current sensor of the above-cited Black patent. In FIG. 2, the coil 25 is a six turn coil positioned to intercept magnetic fields from adjacent circuits. The support circuitry provides a constant current through current sensor and interconnection structure while monitoring the voltage that occurs across that structure. This voltage will be a function of the magnitude of the signal current introduced through coil 25 because of the magnetoresistive nature of structure. The measured voltage is thus an indication of the electrical resistance of current sensor and interconnection structure as well as the magnitude of the current flowing in coil 25, at least for currents in coil 25 having sufficiently small frequency content.

The resistance measured for structure is found to be nearly symmetrical about zero signal currents in coil 25 so that the resistances found for both positive and negative currents through that coil of the same magnitude are approximately equal to one another. However, the resistance of structure is found to be a nonlinear function of the magnitudes of the signal currents in coil 25.

Figure 3:
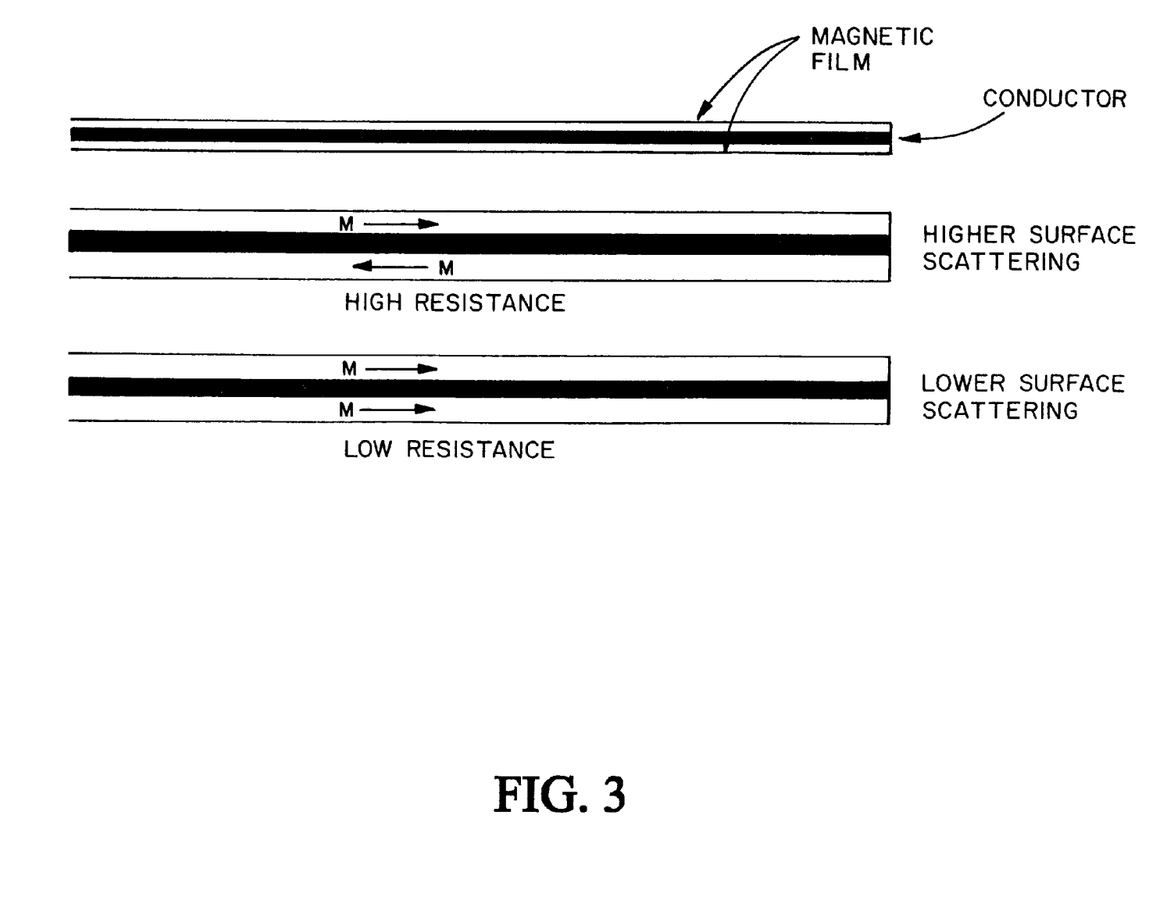
FIG. 3 illustrates typical GMR cross section.
Figure 4:
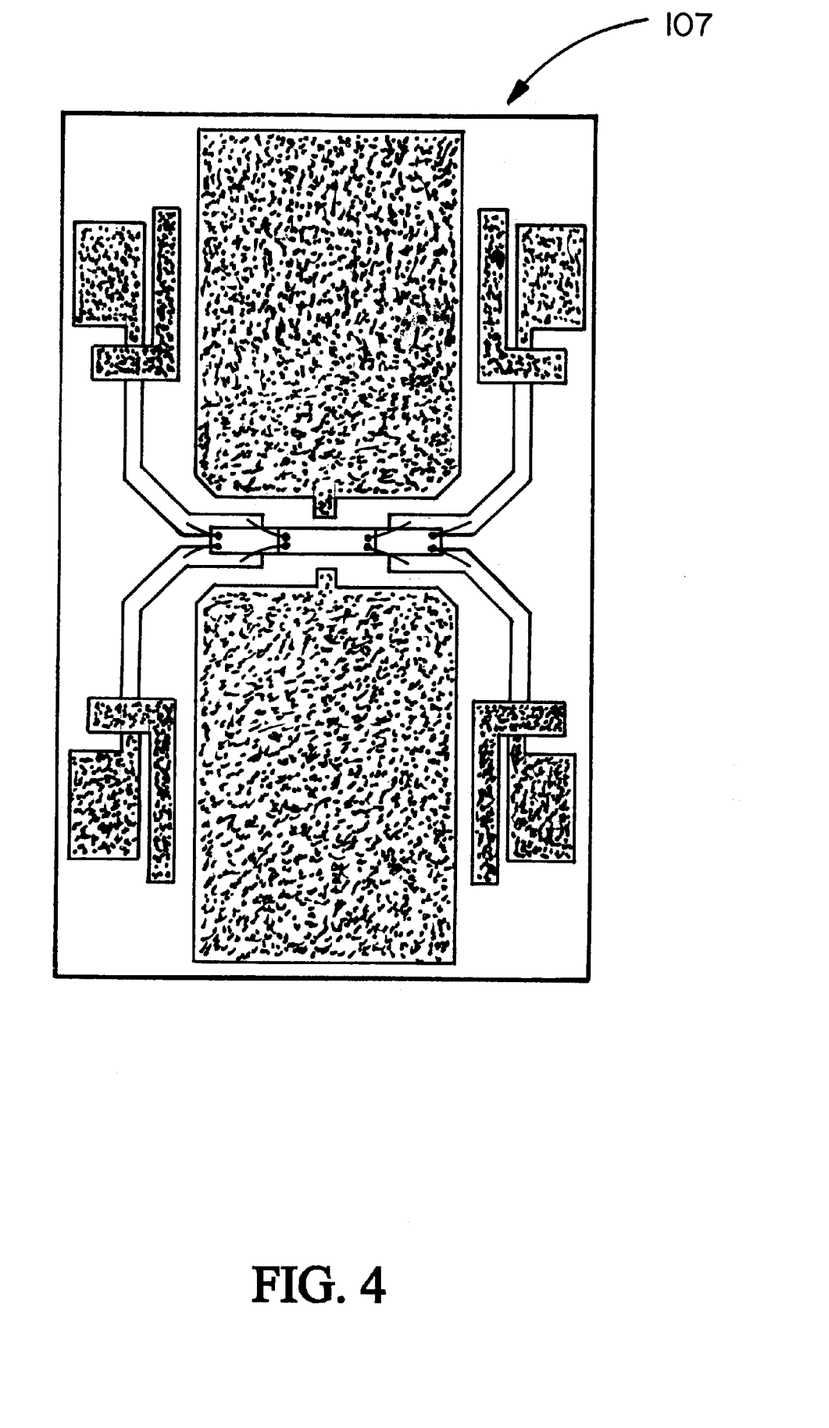
FIG. 4 is a custom permalloy strap hybrid.
Figure 5:
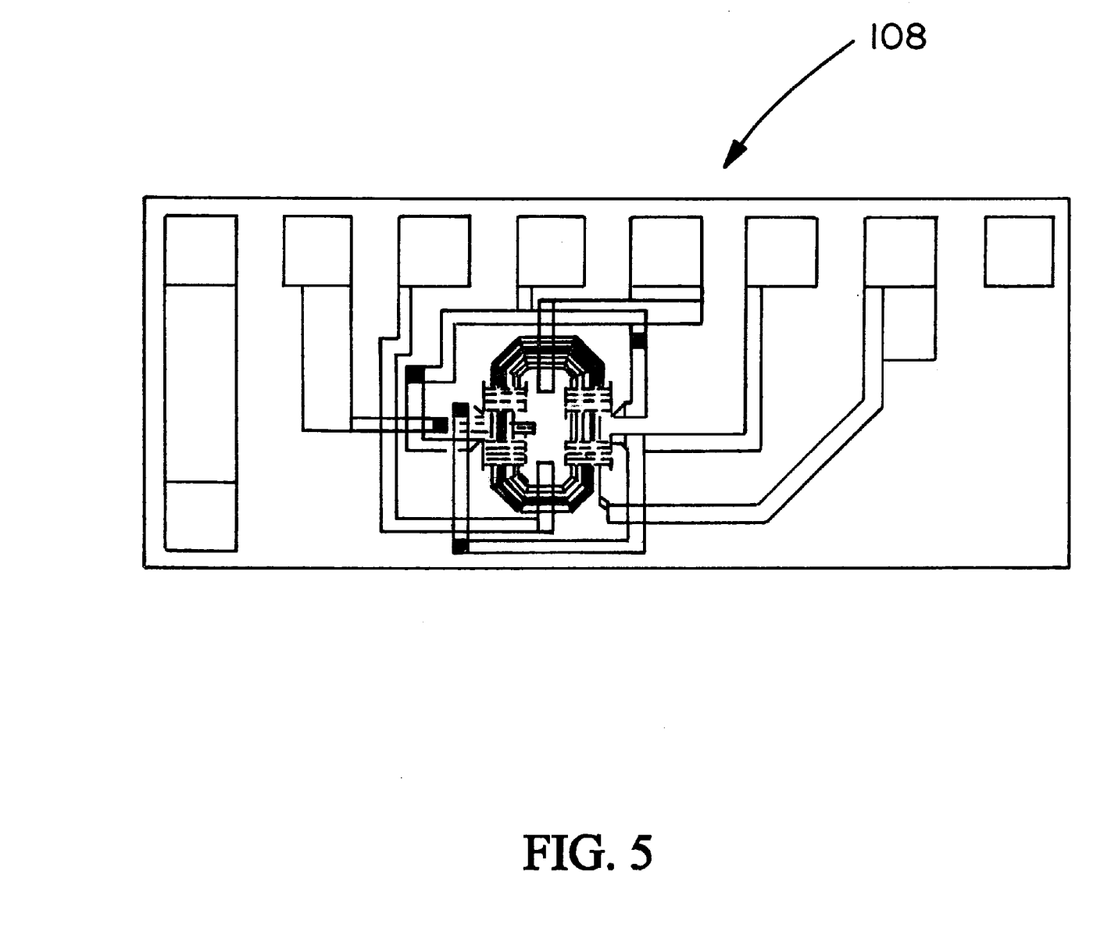
FIG. 5 is a GMR bias bridge current sensor.
Figure 6:
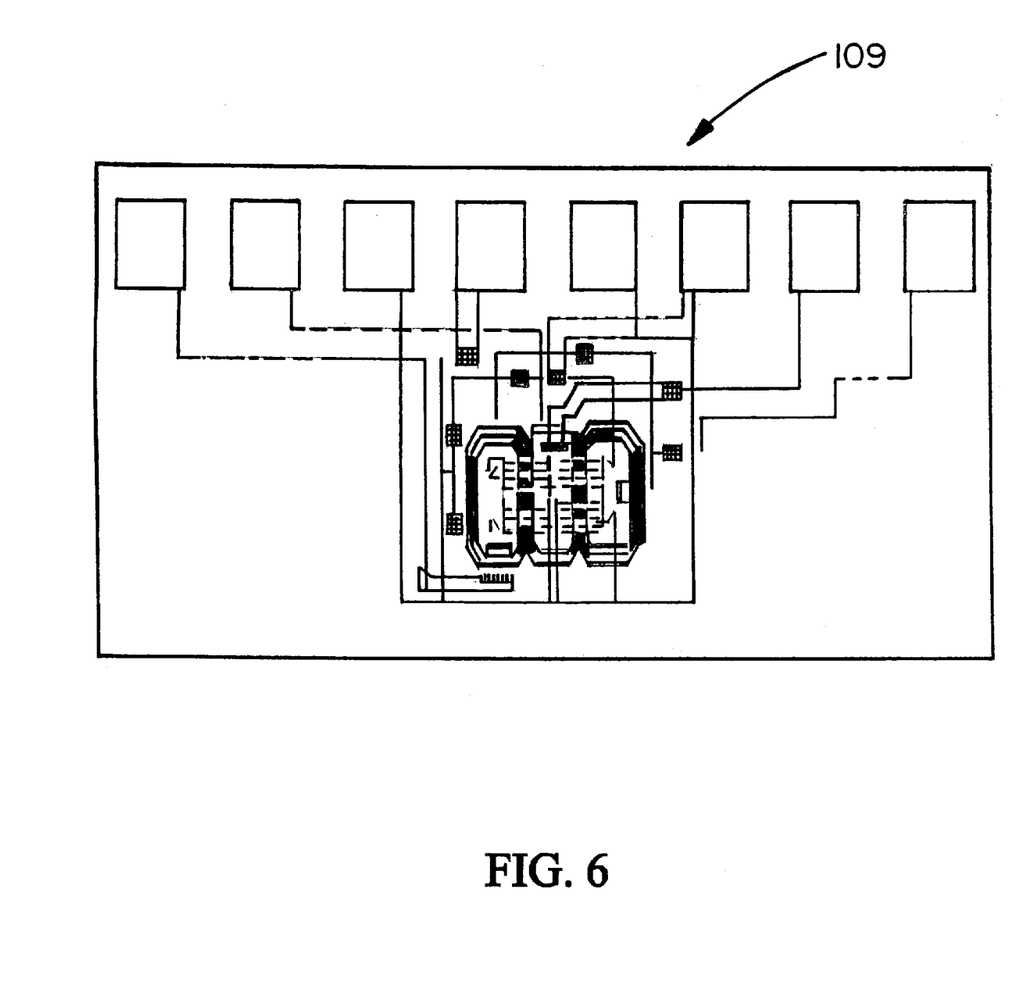
FIG. 6 is a discrete closed loop GMR current sensor.
Figure 7:
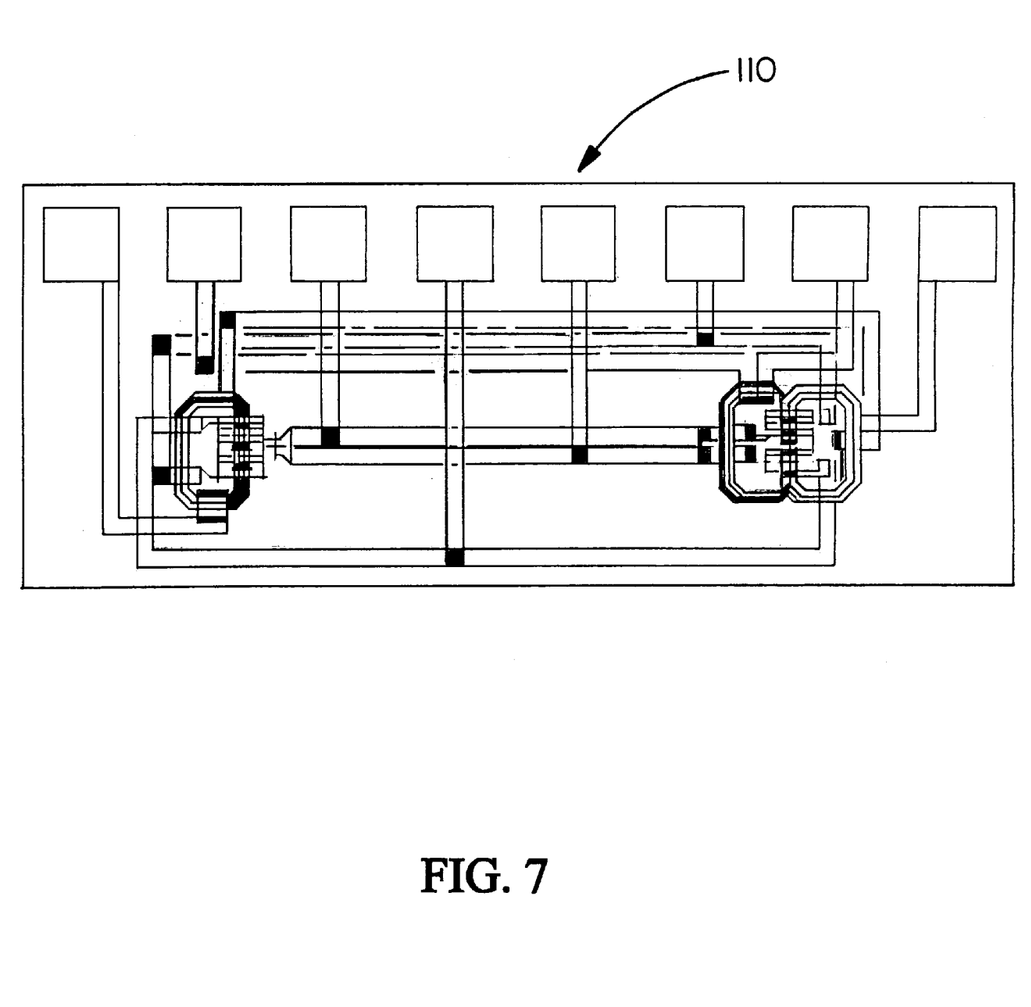
FIG. 7 is a GMR discrete closed loop gradiometer current sensor.

The present invention uses a GMR sensor as show in FIG. 3 where two magnetic thin films are separated by a thin conducting non-magnetic film. The conducting non-magnetic film is lattice matched to the magnetic films and electrons can pass from a magnetic film into a non-magnetic film without scattering. Now consider two cases, one where the two magnetizations are parallel and the other where they are anti-parallel. In the case where the two magnetizations are parallel, the "spin up" (or majority) electrons pass relatively easily from one magnetic layer through the interlayer to the other without scattering. In the other case where the two magnetization's are anti-parallel, the "spin up" (or majority) electrons in one magnetic layer become "spin down" (or minority) electrons in the other, and they tend to be scattered at the interface when passing from one magnetic layer to the other. Thus, there is more scattering (more resistance) when the magnetizations are anti-parallel and less scattering (less resistance) when the magnetizations are parallel. Since scattering has a large effect on thin film resistance, the difference in resistances for the two magnetic states can be relatively large.

One embodiment of the invention is a GMR current sensor that operates over the range of 10–125 Amps. The characteristic of the GMR current sensor to current input is highly dependent on spacing and packaging. A GMR current sensor functions by non-invasively detecting the magnetic fields produced by the sensed current. As such, the detection is highly dependent on the spacing between the sensor and the sensed current and is also sensitive to stray magnetic fields and magnetic material.

To minimize the variations of the current sensor to placement, two hybrid substrates were designed. The use of a hybrid substrate mechanically fixes the sense current with respect to the sensor.

In addition to the hybrid sensors, custom GMR current sensors were designed and fabricated. A unique sensor is a closed loop gradiometer where the gradient of the field produced by the current through the switch rather than the absolute value is measured. This makes the sensor highly immune to stray magnetic fields. Closing the loop results in a highly linear, wide dynamic range sensor. All three devices include on chip bias coils to create bipolar sensors and two of the sensors include a second on chip coil for feedback in a closed loop configuration. Testing of these devices will be completed at the start of the phase II program. FIGS. 4, 5, 6, and 7 are layouts of the custom permalloy strap hybrid, bias bridge sensor, closed loop current sensor and closed loop gradiometer current sensor, respectively.

Figure 8:
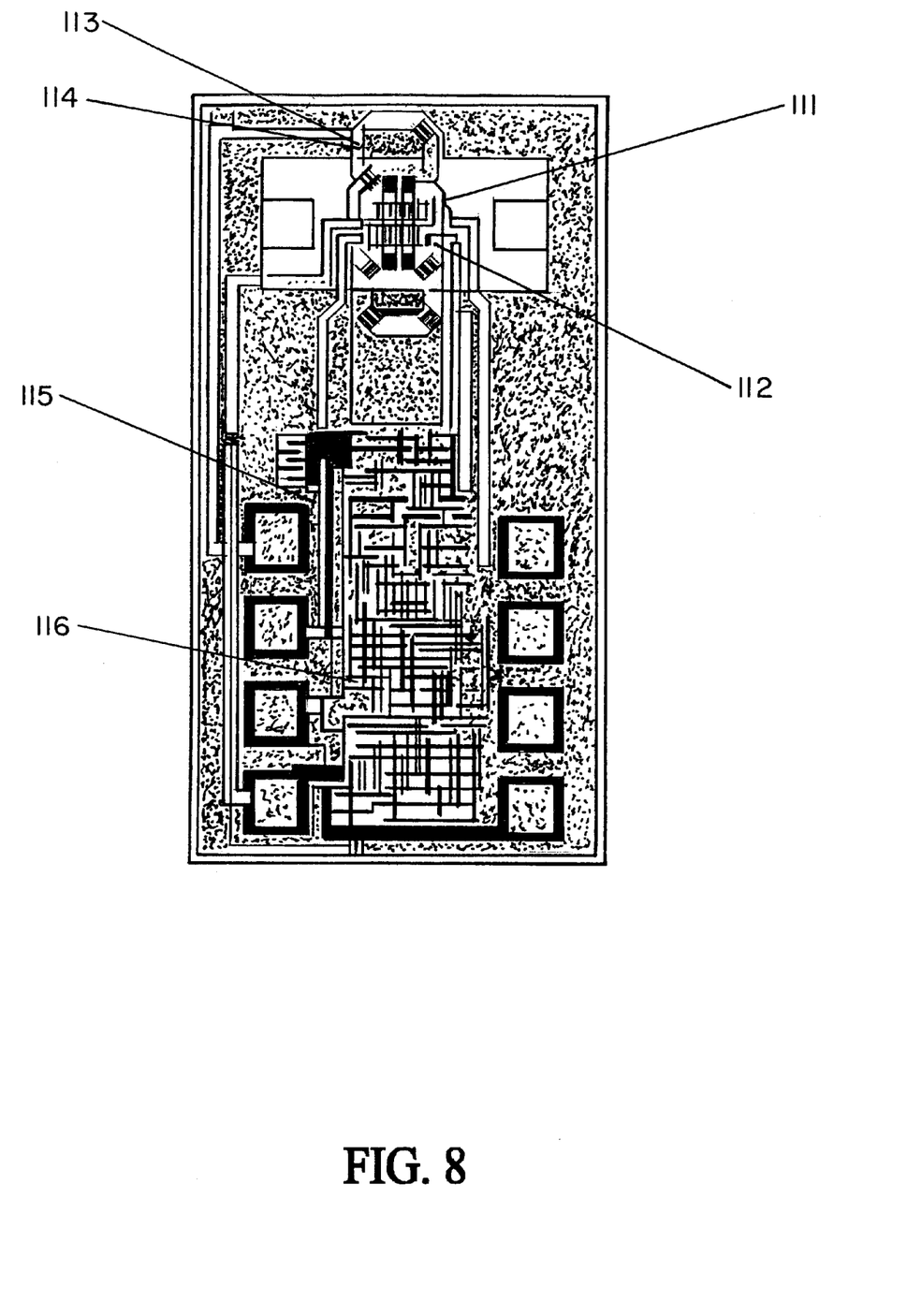
FIG. 8 is a GMR integration closed loop current sensor.

In addition to the proceeding current sensors, one linear isolator was modified to create a fully integrated, closed loop, current sensor. A photomicrograph of this chip is shown in FIG. 8. The device includes a GMR bridge sensor, a coil for biasing the bridges to make the device bipolar, a feedback coil to rebalance the field created by the sense current, and a conductor for the sense current. The electronics consists of an on chip voltage regulator for supplying bridge power and a high gain, low noise amplifier for rebalance. The device has been fabricated, wafer tested, and is being packaged.

Figure 9:
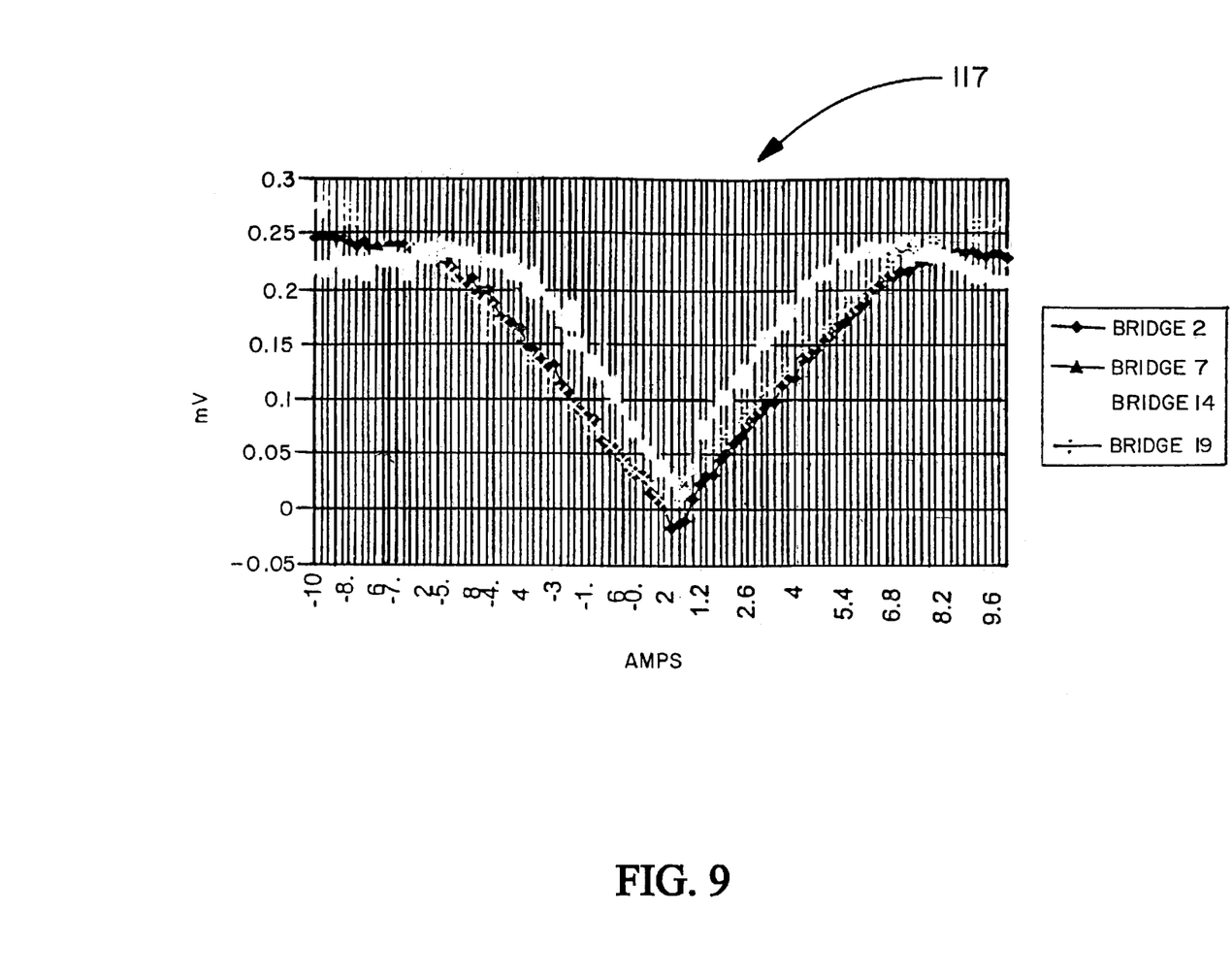
FIG. 9 is a chart of hybrid open loop GMR current sensor response.
Figure 10:
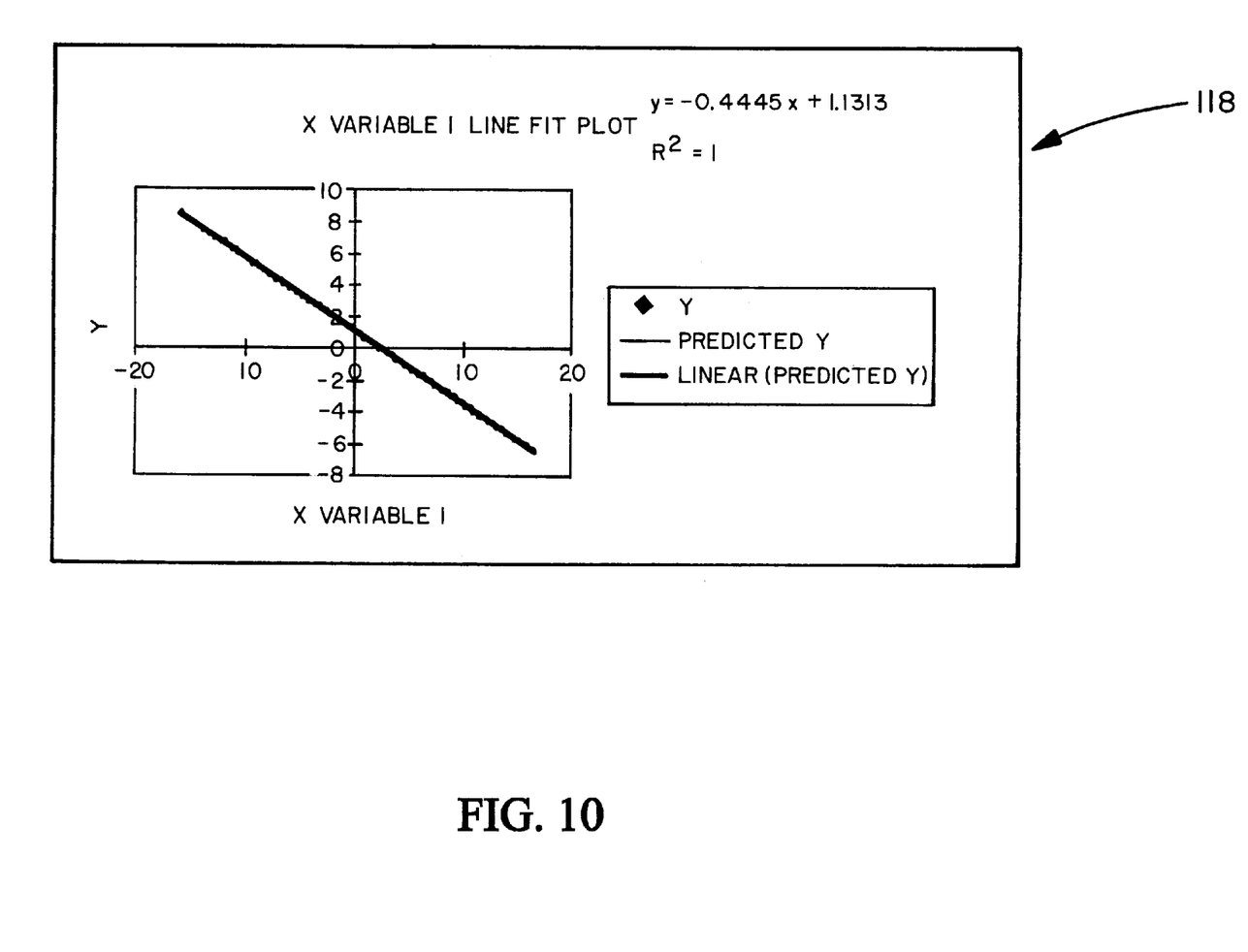
FIG. 10 is a chart of the response of the sensor of FIG. 6.
Figure 11:
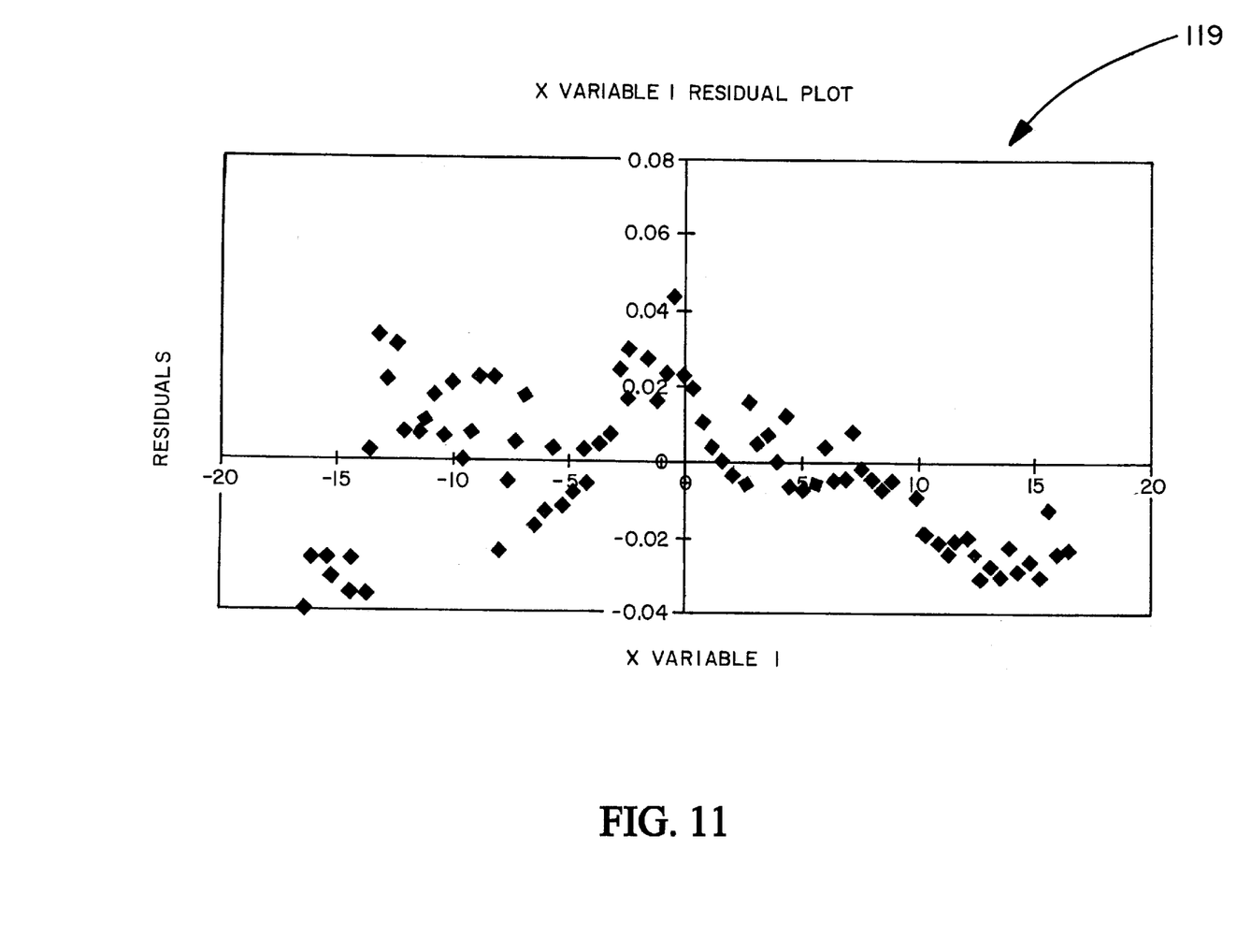
FIG. 11 is a chart of discrete GMR closed loop current sensor residuals.
Figure 12:
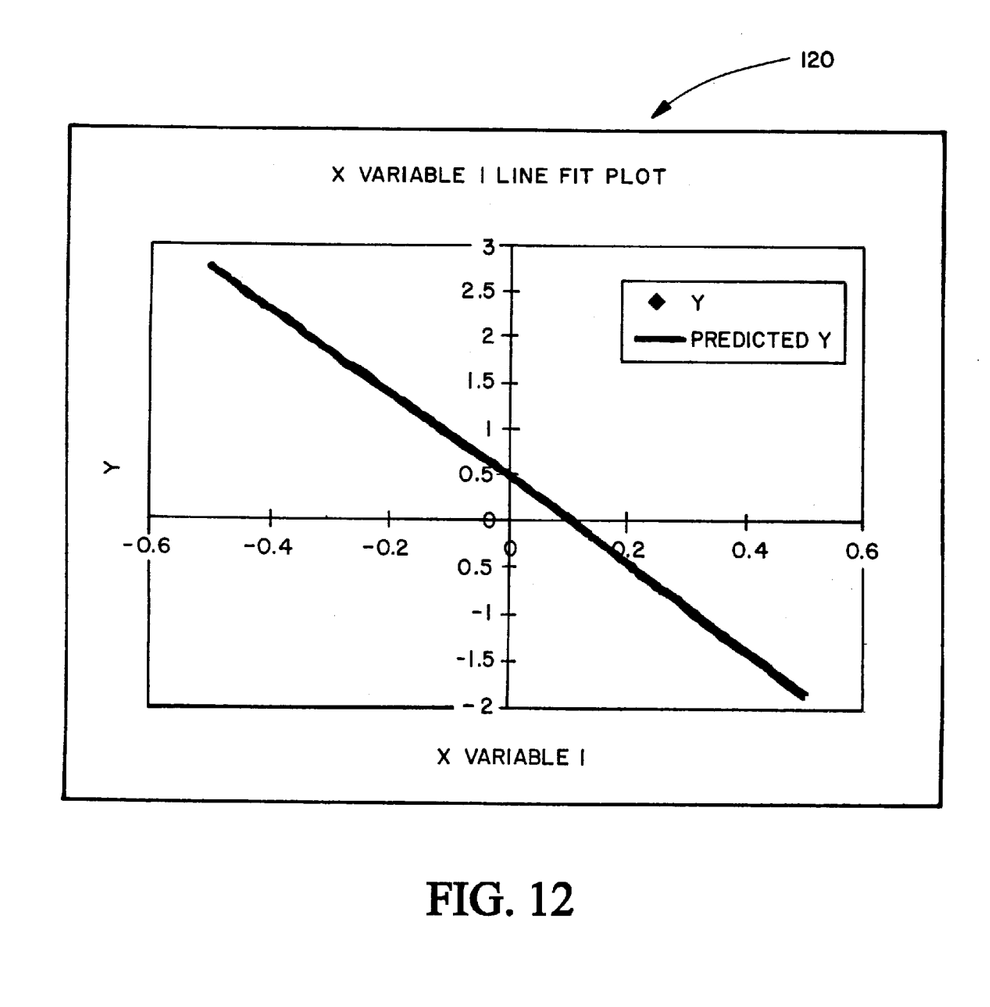
FIG. 12 is a chart of integrated GMR closed loop current sensor response.
Figure 13:
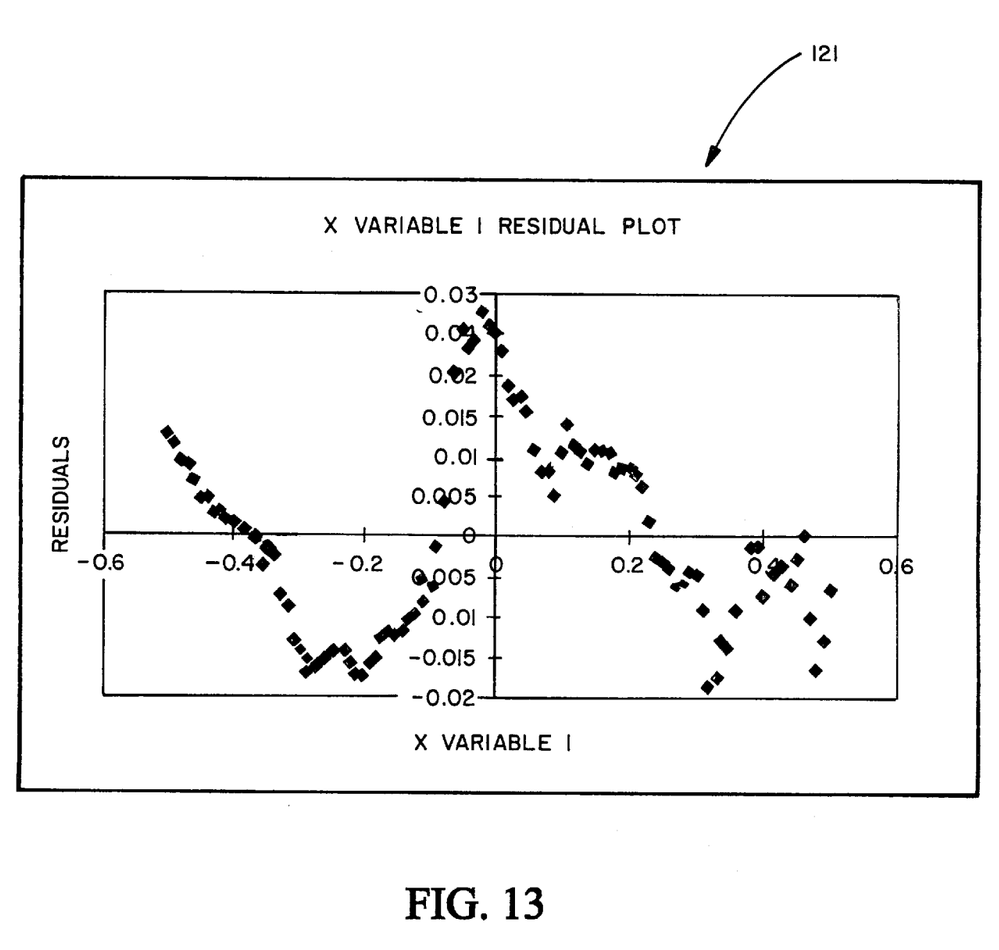
FIG. 13 is a chart of integrated GMR closed loop current sensor residuals.

FIG. 9 shows the output and residuals for a variety of open loop GMR current sensors built on the hybrid substrate. As can be seen from the figures, an open loop GMR current sensor has a high degree of non-linearity and has a unipolar response to an input current. The open loop response can be compared to the closed loop response of a GMR current sensor as shown in FIGS. 10 and 11. For the data shown for the closed loop current sensor consists of a discrete GMR current sensor with integrated bias and feedback coils with external electronics to close the loop. FIGS. 12 and 13 are the same data for the integrated closed loop current sensor shown in FIG. 10. This data was taken in wafer form and we would expect the data to be better for packaged devices.

Testing of external magnetic field effects was also completed on the permalloy strap hybrid version of the GMR current sensors. Data from this testing showed a rejection of greater than 60 dB to external fields.

Figure 14:
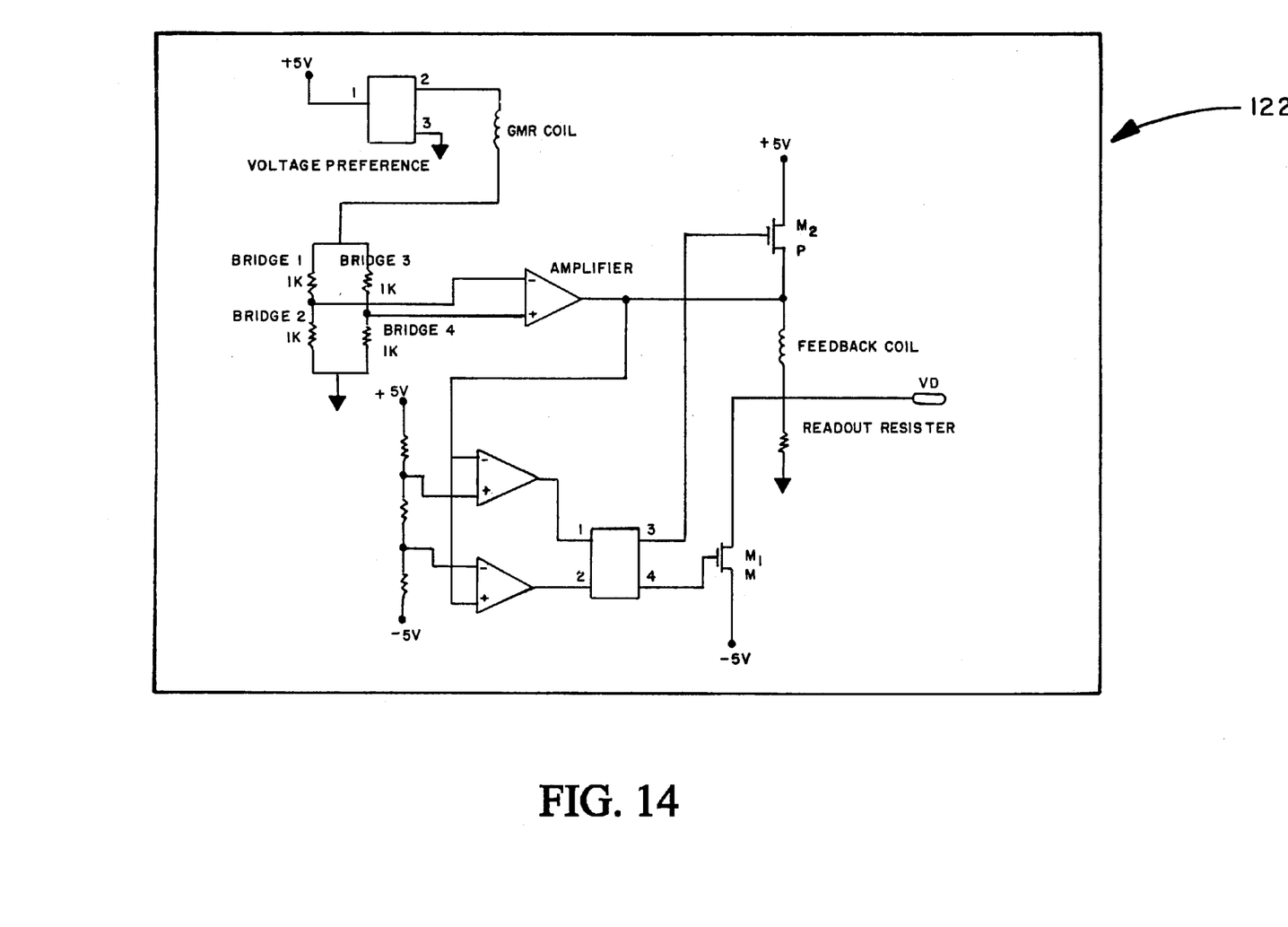
FIG. 14 is a GMR closed loop current sensor electrical schematic.

FIG. 14 is an electrical schematic of a closed loop current sensor. The closed loop current sensor consists of a voltage reference, a GMR biased bridge, and error amplifier, an on chip feedback coil, out to range and built in test (BIT) circuitry. The readout of this circuit is the current through the feedback coil and is directly proportional to the current in the switch.

While the invention has been described in its presently preferred embodiment, it is understood that the words which have been used are words of description rather than words of limitation and that changes within the purview of the appended claims may be made without departing from the scope and spirit of the invention in its broader aspects.

What is claimed is:

1. A Giant MagnetoResistive (GMR) current sensor for sensing a current in a strip line, said GMR current sensor comprising:

a silicon chip a GMR current sensor element placed on said silicon chip for sensing the current in the strip line; and an integrated drive coil placed on said GMR current sensor element with on-chip turns and having a feedback support circuit to cancel spurious fields from the strip line.

2. A GMR current sensor, as defined in claim 1, further comprising:

a first magnetic shield layer placed on top of the integrated drive coil; and a second magnetic shield layer between the silicon chip and the strip line.

* * * * *